(12) United States Patent
Wu et al.

(10) Patent No.: US 7,298,309 B1
(45) Date of Patent: Nov. 20, 2007

(54) DIGITAL-TO-ANALOG CONVERTER (DAC) USING MULTIPLE PWMS AND METHOD THEREOF

(75) Inventors: Shuang-Chin Wu, Hsinchu County (TW); Wei-Kuo Lee, Hsin-Chu Hsien (TW)

(73) Assignee: MStar Semiconductor, Inc., Hsin-Chu Hsien (TW)

( * ) Notice: Subject to any disclaimer, the term of this patent is extended or adjusted under 35 U.S.C. 154(b) by 0 days.

(21) Appl. No.: 11/464,829

(22) Filed: Aug. 16, 2006

(30) Foreign Application Priority Data

Jun. 15, 2006 (TW) .............................. 95121444 A

(51) Int. Cl.
*H03M 1/82* (2006.01)
(52) U.S. Cl. ...................... 341/152; 341/144
(58) Field of Classification Search ......... 341/130–160
See application file for complete search history.

(56) References Cited

U.S. PATENT DOCUMENTS

| | | | |
|---|---|---|---|
| 4,908,710 A * | 3/1990 | Wakai et al. | 348/793 |
| 5,872,603 A * | 2/1999 | Ohsawa | 348/691 |
| 6,362,766 B1 | 3/2002 | Rowan et al. | |
| 6,606,046 B2 | 8/2003 | Kanno | |
| 6,801,146 B2 * | 10/2004 | Kernahan et al. | 341/122 |
| 7,019,502 B2 * | 3/2006 | Walters et al. | 323/282 |

\* cited by examiner

*Primary Examiner*—Lam T. Mai
(74) *Attorney, Agent, or Firm*—Winston Hsu

(57) ABSTRACT

A digital-to-analog converter (DAC) for generating an analog output voltage according to a digital input value includes a plurality of pulse width modulation (PWM) units and a voltage generating unit. The digital input value includes a plurality of bit segments. The plurality of PWM units generates a plurality of PWM signals according to the plurality of bit segments of the digital input value. The voltage generating unit is coupled to the plurality of PWM units and generates the analog output voltage according to the plurality of PWM signals.

10 Claims, 2 Drawing Sheets

DIGITAL-TO-ANALOG CONVERTER (DAC) USING MULTIPLE PWMS AND METHOD THEREOF

BACKGROUND OF THE INVENTION

1. Field of the Invention

The present invention relates to a digital-to-analog converter (DAC), and more particularly, to a DAC that is realized by a plurality of pulse width modulation (PWM) units, and a method thereof.

2. Description of the Prior Art

A digital-to-analog converter (DAC) is a device that converts a digital input value into a corresponding analog output voltage, which is then supplied to a backend circuit. For example, in a television (TV) system, after the user has chosen a TV channel, the TV system determines a digital input value according to the chosen TV channel. A DAC is utilized to convert the digital input value into an analog output voltage, which is then supplied to a TV tuner and allows the TV tuner to process received TV signals accordingly.

With technological advances, electrical products demand higher and higher resolutions on DACs. More specifically, a DAC is required to generate an accurate analog output voltage according to a digital input value with increased bit counts. However, the cost of a high resolution DAC is usually much higher than that of a low resolution DAC. Since cost is always a critical concern when manufacturing electrical products, reducing the costs of high resolution DACs has becomes a desire of manufacturers of electrical products.

SUMMARY OF THE INVENTION

One of the objectives of the present invention is to provide high resolution DACs with low costs.

The invention discloses a DAC for generating an analog output voltage according to a digital input value. The digital input value comprises a plurality of bit segments. The DAC comprises a plurality of PWM units and a voltage generating unit. The plurality of PWM units generates a plurality of PWM signals according to the plurality of bit segments. The voltage generating unit is coupled to the plurality of PWM units and generates the analog output voltage according to the plurality of PWM signals.

In the aforementioned DAC, a first and a second PWM unit of the plurality of PWM units generate a first and a second PWM signal of the plurality of PWM signals according to a first and a second bit segment of the plurality of bit segments, respectively. In the digital input value, the first bit segment is a predetermined number times the significance of the second bit segment.

The invention also discloses a method for generating an analog output voltage according to a digital input value. The method comprises segmenting the digital input value into a plurality of bit segments, generating a plurality of PWM signals according to the plurality of bit segments, and generating the analog output voltage according to the plurality of PWM signals.

In the aforementioned method, the step of generating a plurality of PWM signals according to the plurality of bit segments comprises generating a first and a second PWM signal of the plurality of PWM signals according to a first and a second bit segment of the plurality of bit segments, respectively. And in the digital input value, the first bit segment is a predetermined number times the significance of the second bit segment.

These and other objectives of the present invention will no doubt become obvious to those of ordinary skill in the art after reading the following detailed description of the preferred embodiment that is illustrated in the various figures and drawings.

DETAILED DESCRIPTION

Pulse width modulation (PWM) is a modulation technology that can be applied to realize DACs. Generally speaking, a high resolution PWM unit should be used to make a high resolution DAC. For example, if a DAC with 16-bit resolution is required, a PWM unit with 16-bit resolution should be used to realize the DAC. However, a high resolution PWM unit is much more expansive than a low resolution PWM unit. Moreover, the cost-resolution ratio of a high resolution PWM unit is always larger than that of a low resolution PWM unit. Therefore, the overall cost of two 8-bit resolution DACs is much lower than the cost of a single 16-bit resolution DAC.

Figure 1:
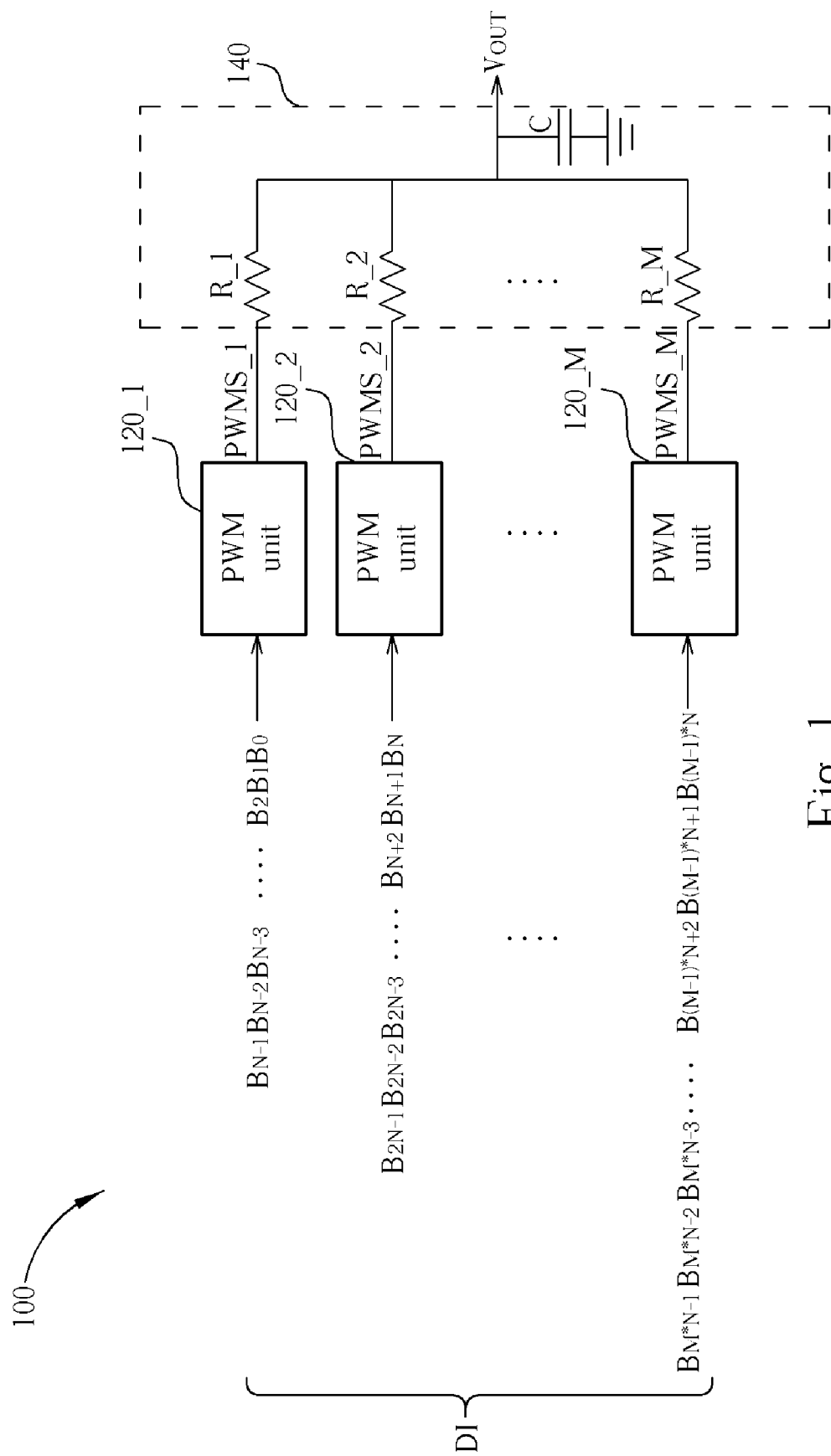
FIG. 1 shows a DAC according to an exemplary embodiment of the present invention.

To reduce the costs of high resolution DACs, this disclosure proposes an idea of using a plurality of PWM units, each of which has relatively low resolution, to realize a single high resolution DAC. FIG. 1 shows an embodiment of the proposed DAC. The resolution of the DAC 100 shown in FIG. 1 is M*N bits, where both M and N are positive integers. In other words, the DAC 100 generates an analog output voltage $V_{OUT}$ according to a digital input value DI that is M*N-bit-long. The binary form of the digital input value DI is $B_{M*N-1}B_{M*N-2}B_{M*N-3} \ldots B_2B_1B_0$, where $B_{M*N-1}$ is the most significant bit (MSB) and $B_0$ is the least significant bit (LSB).

The DAC 100 comprises M PWM units 120_1~120_M and a voltage generating unit 140. The resolution of each of the M PWM units 120_1~120_M is N bits. For an integer K between 1 and M, a $K^{th}$ PWM unit 120_K generates a $K^{th}$ PWM signal PWMS_K according to a $K^{th}$ bit segment of the digital input value DI. The binary form of the $K^{th}$ bit segment of DI is $B_{K*N-1}B_{K*N-2}B_{K*N-3} \ldots B_{(K-1)*N+2}B_{(K-1)*N+1}B_{(K-1)*N}$. The duty cycle of the $K^{th}$ PWM signal PWMS_K is determined by the value of the $K^{th}$ bit segment $B_{K*N-1}B_{K*N-2}B_{K*N-3} \ldots B_{(K-1)*N+2}B_{(K-1)*N+1}B_{(K-1)*N}$. Since there are N bits included in the $K^{th}$ bit segment, the duty cycle of the $K^{th}$ PWM signal PWMS_K is selected from $2^N$ possible duty cycles. The difference between a largest and a smallest duty cycles of the $2^N$ possible duty cycles is $(2^N)-1$ times the size of a step. For example, when N equals 8, the step is approximately 0.3922%.

When the value of the $K^{th}$ bit segment $B_{K*N-1}B_{K*N-2}B_{K*N-3} \ldots B_{(K-1)*N+2}B_{(K-1)*N+1}B_{(K-1)*N}$ is increased by 1, the duty cycle of the $K^{th}$ PWM signal PWMS_K is increased by one step, and the voltage generating unit 140 elevates the analog output voltage $V_{OUT}$ by a $K^{th}$ voltage step VS_K. Since in the digital input value DI, a $K_1^{th}$ bit segment is $2^{[(K_1-K_2)*N]}$ times the significance of a $K_2^{th}$ bit segment, a $K_1^{th}$ voltage stepVS_$K_1$ should be $2^{[(K_1-K_2)*N]}$ times the size of a $K_2^{th}$ voltage stepVS_$K_2$. In other words, the voltage steps VS_1~VS_M conform to the following equation:

$$VS\_M = VS\_(M-1) \times 2 \wedge N = VS\_(M-2) \times 2 \wedge (2*N) =$$
$$\ldots = VS\_2 \times 2 \wedge [(M-2)*N] = VS\_1 \times 2 \wedge [(M-1)*N].$$

In order for the voltage steps VS_1~VS_M to conform to the equation, the voltage generating unit 140 of this embodiment comprises M resistors R_1~R_M and one capacitor C. Among the M resistors R_1~R_M, a $K^{th}$ resistor R_K has a first end coupled to the $K^{th}$ PWM unit 120_K for receiving the $K^{th}$ PWM signal PWMS_K, and a second end coupled to a first end of the capacitor C, where K is an integer between 1 and M. A second end of the capacitor C is coupled to a node having a reference voltage level. For example, the node is ground. The resistances of the resistors R_1~R_M conform to the following equation:

$$R\_M = R\_(M-1) \times 2 \wedge N\_R\_(M-2) \times 2 \wedge (2*N) =$$
$$\ldots = R\_2 \times 2 \wedge [(M-2)*N] = R\_1 \times 2 \wedge [(M-1)*N].$$

The resolution of the DAC 100 is M*N bits, however, no PWM unit with M*N bits resolution is required. Relatively, M PWM units, each of which is N bits in resolution, are used to make the DAC 100. Since the overall cost of the M N-bit-resolution PWM units is much lower than that of a single M*N-bit-resolution PWM unit, the DAC 100 is more cost effective than the M*N-bit-resolution DACs of the prior art.

Figure 2:
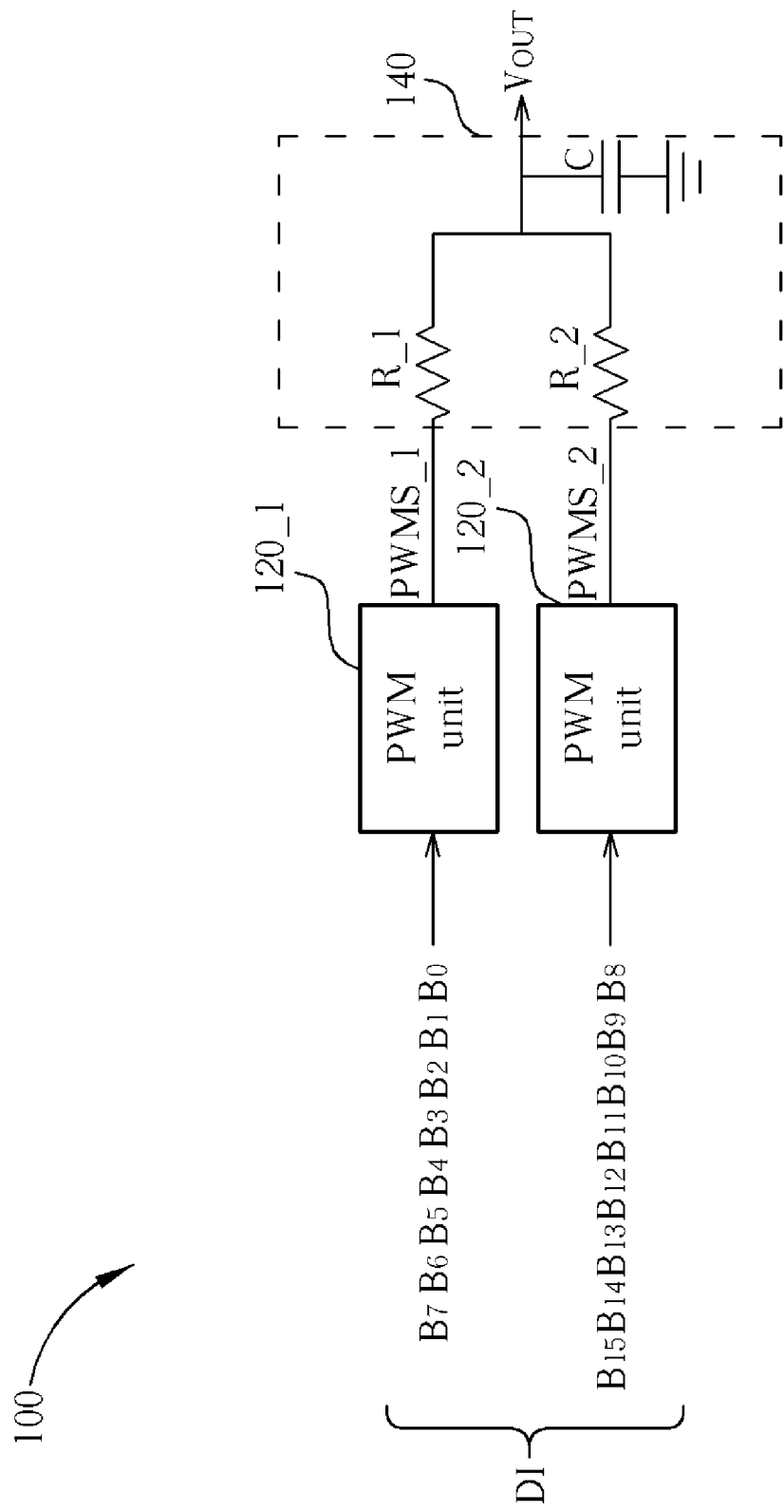
FIG. 2 shows an example of the DAC of FIG. 1.

FIG. 2 shows an example of the DAC 100 of FIG. 1. In the example shown in FIG. 2, M is equal to 2 while N is equal to 8. The binary form of the digital input value DI is $B_{15}B_{14}B_{13} \ldots B_2B_1B_0$, the binary form of the first bit segment is $B_7B_6B_5 \ldots B_2B_1B_0$, and the binary form of the second bit segment is $B_{15}B_{14}B_{13} \ldots B_{10}B_9B_8$. The first bit segment can be referred to as a low portion of the digital input value DI, and the second bit segment can be referred to as a high portion of the digital input value DI. The resolution of both the first PWM unit 120_1 and the second PWM unit 120_2 is 8 bits. The second resistor R_2 has 2^8=256 times the resistance of the first resistor R_1.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital-to-analog converter (DAC), for generating an analog output voltage according to a digital input value, the digital input value comprising a plurality of bit segments, the DAC comprising:
   a plurality of pulse width modulation (PWM) units, for generating a plurality of PWM signals according to the plurality of bit segments, respectively; and
   a voltage generating unit, coupled to the plurality of PWM units, for generating the analog output voltage according to the plurality of PWM signals.

2. The DAC of claim 1, wherein the plurality of bit segments comprises a first bit segment and a second bit segment, and wherein the plurality of PWM units comprises a first PWM unit and a second PWM unit for generating a first PWM signal and a second PWM signal according to the first bit segment and the second bit segment, respectively.

3. The DAC of claim 2, wherein:
   the voltage generating unit elevates the analog output voltage by a first voltage step whenever a duty cycle of the first PWM signal is increased by a predetermined time period;
   the voltage generating unit elevates the analog output voltage by a second voltage step whenever a duty cycle of the second PWM signal is increased by the predetermined time period; and
   the second voltage step is a predetermined number times a size of a first voltage step.

4. The DAC of claim 3, wherein the voltage generating unit comprises:
   a first resistor, a first end of the first resistor being coupled to the first PWM unit for receiving the first PWM signal;
   a second resistor, a first end of the second resistor being coupled to the second PWM unit for receiving the second PWM signal; and
   a capacitor, a first end of the capacitor being coupled to a second end of the first resistor and a second end of the second resistor for generating the analog output voltage, a second end of the capacitor being coupled to a node having a reference voltage level.

5. The DAC of claim 4, wherein the second resistor has the predetermined number times the resistance of the first resistor.

6. A method for generating an analog output voltage according to a digital input value, the method comprising:
   segmenting the digital input value into a plurality of bit segments;
   generating a plurality of PWM signals according to the plurality of bit segments, respectively; and
   generating the analog output voltage according to the plurality of PWM signals.

7. The method of claim 6, wherein generating the plurality of PWM signals according to the plurality of bit segments comprises:
   generating a first and a second PWM signal of the plurality of PWM signals according to a first and a second bit segment of the plurality of bit segments, respectively.

8. The method of claim 7, wherein generating the analog output voltage according to the plurality of PWM signals comprises:
   elevating the analog output voltage by a first voltage step whenever a duty cycle of the first PWM signal is increased by a predetermined time period;
   elevating the analog output voltage by a second voltage step whenever the duty cycle of the second PWM signal is increased by the step;
   wherein the second voltage step is a predetermined number times a size of the first voltage step.

9. A digital-to-analog converter (DAC), for converting a digital input value to an analog output voltage, the DAC comprising:
   a first pulse width modulation (PWM) unit, receiving a low portion of the digital input value to generate a first PWM signal;
   a second pulse width modulation (PWM) unit, receiving a high portion of the digital input value to generate a second PWM signal;
   a first resistor, one end of the first resistor being coupled to the output of the first PWM unit;
   a second resistor, one end of the second resistor being coupled to an output of the second PWM unit; and a capacitor, one end of the capacitor being coupled to the other ends of the first and the second resistors and the other end of the capacitor being coupled to a node having a reference voltage level, wherein the analog output voltage is crossed on the capacitor.

10. The DAC of claim 9, wherein a resistance of the second resistor has a predetermined number times a resistance of the first resistor.

* * * * *